(12) United States Patent
Clark, Jr. et al.

(10) Patent No.: US 6,940,764 B2
(45) Date of Patent: *Sep. 6, 2005

(54) MEMORY WITH A BIT LINE BLOCK AND/OR A WORD LINE BLOCK FOR PREVENTING REVERSE ENGINEERING

(75) Inventors: William M. Clark, Jr., Camarillo, CA (US); James P. Baukus, Westlake Village, CA (US); Lap-Wai Chow, South Pasadena, CA (US)

(73) Assignee: HRL Laboratories LLC, Malibu, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 10/451,673

(22) PCT Filed: Mar. 12, 2002

(86) PCT No.: PCT/US02/07587

§ 371 (c)(1),
(2), (4) Date: Jun. 20, 2003

(87) PCT Pub. No.: WO02/091190

PCT Pub. Date: Nov. 14, 2002

(65) Prior Publication Data

US 2004/0047188 A1 Mar. 11, 2004

Related U.S. Application Data

(63) Continuation-in-part of application No. 09/848,564, filed on May 3, 2001, now Pat. No. 6,459,629.

(51) Int. Cl.$^7$ .................................................. G11C 7/00
(52) U.S. Cl. .................................... 365/195; 365/185.04
(58) Field of Search ................................ 365/195, 196, 365/225.7, 185.04

(56) References Cited

U.S. PATENT DOCUMENTS

| | | | |
|---|---|---|---|
| 4,814,849 A | 3/1989 | Schrenk | 357/74 |
| 4,962,484 A | 10/1990 | Takeshima et al. | 365/226 |
| 5,506,806 A | 4/1996 | Fukushima | 365/195 |
| 5,576,988 A | 11/1996 | Kuo et al. | 365/185.04 |
| 5,783,846 A | 7/1998 | Baukus et al. | 257/204 |
| 5,866,933 A | 2/1999 | Baukus et al. | 257/368 |
| 5,930,663 A | 7/1999 | Baukus et al. | 438/598 |
| 6,064,110 A | 5/2000 | Baukus et al. | 257/652 |
| 6,117,762 A | 9/2000 | Baukus et al. | 438/618 |
| 6,154,388 A | 11/2000 | Oh | 365/185.04 |
| 6,459,629 B1 | 10/2002 | Clark, Jr. et al. | 365/195 |
| 6,608,792 B2 * | 8/2003 | Pitts | 365/225.7 |
| 6,633,501 B2 * | 10/2003 | Wedel | 365/195 |
| 6,710,619 B2 * | 3/2004 | Rzittka | 326/37 |

FOREIGN PATENT DOCUMENTS

| | | |
|---|---|---|
| EP | 0 645 774 A2 | 3/1995 |
| WO | 96/31101 | 10/1996 |

OTHER PUBLICATIONS

United Kingdom Examination Report for the corresponding United Kingdom Application No. GB0325521.3, issued on Aug. 20, 2004 (3 pages).

* cited by examiner

Primary Examiner—Tan T. Nguyen
(74) Attorney, Agent, or Firm—Ladas & Parry LLP

(57) ABSTRACT

A method and circuit for blocking unauthorized access to at least one memory cell in a semiconductor memory. The method includes providing a switch and/or a link which assumes an open state when access to the at least one memory cell is to be blocked; and coupling-a data line associated with the at least one memory cell to a constant voltage source in response to the switch or link assuming an open state.

23 Claims, 4 Drawing Sheets

MEMORY WITH A BIT LINE BLOCK AND/OR A WORD LINE BLOCK FOR PREVENTING REVERSE ENGINEERING

This application is a continuation-in-part of U.S. patent application Ser. No. 09/848,564, filed on May 3, 2001, now U.S. Pat. No. 6,459,629.

TECHNICAL FIELD

The present invention relates to Integrated Circuits (ICs) and semiconductor devices and their methods of manufacture wherein the semiconductor devices provide semiconductor memories, such as ROMs, EPROMs or EEPROMs, and have bit line block protection circuitry and/or word line block protection circuitry to inhibit or prevent the unauthorized reading of data stored in the semiconductor device by a party interested in, for example, reverse engineering the IC or system.

BACKGROUND OF THE INVENTION

Data and software can be very valuable and those involved in the collection of data and those involved in preparation of software will often go to great lengths to try to protect the data and/or software from unauthorized parties. In modem electronic devices, data and software are often stored in memory, and more particularly in ICs or systems which include memory in the form of an array of memory cells. FIG. 1 depicts a schematic of a conventional memory array formed of an array of memory cells 22. The cells 22 are addressed by signals appearing on (i) row or word lines 21 in combination with signals appearing on column or bit lines 20. The array shown in FIG. 1 represents only a very small portion of memory since a modern memory IC have millions of such cells 22. The individual cells 22 can be in the form of ROM, RAM, EPROM, EEPROM, etc., cells, as is known in the art. Each individual memory cell 22 could be as simple as a programmable junction or it can represent a memory circuit. The details of how the individual cells 22 are implemented are not important in terms of the present invention.

The design and development of software and/or data associated with semiconductor Integrated Circuits (ICs) tend to be rather expensive and, in fact, many hours of software engineering talent is required to develop such software and/or data. The software and/or data are stored in memories associated with the ICs, the memories either comprising, on-board memories (where the memory is integrated with other elements such as data processors, digital signal processors, CPU's and the like) or comprising separate, discrete memory devices. In either case the memory is typically formed by an array of memory cells such as that depicted by FIG. 1. The software and/or data may be stored permanently in the memory or the software and/or data may be erasable and/or may be dynamic. The ICs themselves may be Application Specific ICs (ASICs) or regular off-the-shelf components or devices.

If the data and/or software are valuable, then reverse engineers are apt to try to get at the software and/or data. Since software may be considered as a type of data, the term data as used herein is intended to refer to any kind of data whatsoever, including application software and/or firmware. If the software is stored more or less permanently on an IC it is not infrequently referred to as firmware. As such, the term data as used herein also includes firmware.

Some in the art avoid both the expense involved in the design and development of data and the significant time involved in bringing a new integrated circuit design, which might include data stored therein, to the marketplace, by resorting to reverse engineering practices that take apart, probe, and otherwise examine existing ICs. Their purpose is to try to determine the physical structures and methods used to make the integrated circuit for purposes of subsequent copying. They also try to read the data stored in such ICs. This reverse engineering, which often relies on obtaining planar optical images of a circuit or on reading out data stored on an IC via its external or internal connections, in essence tries to bypass the typical product development cycles and expenses involved in producing integrated circuits and/or the data used therewith.

Since the reverse engineer is trying to go for a "free ride" on the efforts of others, various approaches have been developed to try to thwart the reverse engineer in the field of semiconductor devices, including devices which have memory for storing data. If the semiconductor device is a memory device or an IC containing memory, the data stored in such memory is usually read out on bit lines in response to an address placed on an address line. These bit and address lines may be more or less easily accessible from external physical connections on an IC or the bit and address lines may be buried within an IC so that they are not readily accessible by making external connections to the IC. Different techniques have been used to try to thwart the reverse engineer in the prior art. For example, metal layers have been disposed over memory, which metal is tied to either a high or low potential, but isolated from the memory itself, to try to protect the memory from being read using Scanning Electron Microscopy (SEM) or Voltage Contrast Scanning Electron Microscopy (VCSEM), techniques which are popular with the reverse engineer.

In the prior art, coatings have also been used to try to protect ICs from reverse engineering. And also it is known in the prior art to scramble the address lines, which will slow down, but not really thwart, the reverse engineer. Moreover, these techniques are primarily aimed at protecting data stored in ICs where the bit lines and address lines are buried on the IC so that the data can not be easily read out by making external connections to the IC.

Since the time and energy required to develop new data is considerable, reverse engineering has its followers. Indeed, the reverse engineer's object is to make a slavish copy of the original data. The reverse engineer does not seem to be deterred by the fact that in many countries ICs are legally protected against copying by some form of mask work protection and that data is often protected against copying by a copyright law. As such, in order to protect the considerable investment made in data and in IC designs using such data, other or additional steps are needed to deter such slavish copying.

The prior art includes U.S. Pat. No. 5,866,933 to Baukus, Chow and Clark which teaches how transistors in a CMOS circuit are connected by implanted (therefore hidden and buried) lines between the transistors, via modifying the p+ and n+ source/drain masks. These implanted interconnections are further used to make a 3-input AND and OR circuit look substantially the same.

The prior art also includes U.S. Pat. Nos. 5,783,846 and 5,930,663 to Baukus, Chow and Clark, which teach a further modification in the source/drain implant masks so that the implanted connecting lines between transistors have a gap inserted with approximately the length of the minimum feature size of the CMOS technology being used. If this gap is "filled" with one kind of implant (depending on the implanted connecting line being p or n) the line conducts; but, if it is filled with the other kind of implant the line does not conduct. These gaps are called "channel blocks." Their use requires the reverse engineer to determine connectivity on the basis of resolving the n or p implant at the minimum feature size of the channel block. Further, the geometrical ambiguity technique in U.S. Pat. No. 5,866,933 is extended by modifying the transistor sizes, and metal connection routings to eliminate keys by which the reverse engineer can find inputs, outputs, gate lines etc. that help determine circuit functionality.

SUMMARY OF THE INVENTION

In one aspect, the present invention provides a circuit and a method for blocking unauthorized access to at least one memory cell in a semiconductor memory. The circuit and method includes providing a switch and/or a link which assumes an open state when access to the at least one memory cell is to be blocked; and coupling a data line associated with the at least one memory cell to a constant voltage source in response to the switch or link assuming an open state.

In another aspect, the present invention provides a circuit for blocking access to a data line associated with at least one memory cell, the circuit preferably comprising: a first transistor coupling the data line to a constant voltage source when the first transistor is conductive; a second transistor coupled in series with a link, and/or a switch, the link and/or the switch having an open circuit state and a closed circuit state; and an inverter having an input coupled to a junction between the second transistor and the link and/or the switch, the inverter having an output coupled to a gate of the first transistor and also to a gate of the second transistor.

DESCRIPTION OF A PREFERRED EMBODIMENT

Figure 1:
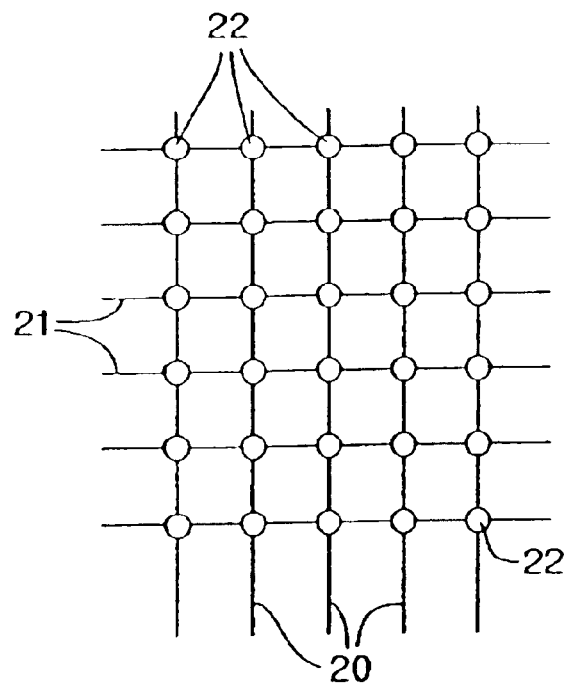
FIG. 1 is a schematic diagram of a conventional array of memory cells.

In accordance with the present invention, a block circuit is provided that will come into play in certain situations to block preferably the bit lines and/or word lines of a memory embodied either as a memory IC or in an IC which includes memory as a portion thereof in order to make it substantially more difficult for a reverse engineer to try to uncover the data stored in the memory.

The operation of a first embodiment of a circuit 1 in accordance with the present invention will be described functionally with reference to the circuit schematic of FIG. 2. An n-channel transistor 10 is connected directly to a relatively low voltage source (e.g. $V_{ss}$ or ground) and through an optional switch and a link 11 to a relatively high voltage source (e.g. $V_{dd}$). The switch and/or link 11, when open circuited, causes the circuit to keep data associated with a bit line 20 from being read out in response to signals on the memory word lines 21 (see FIG. 3). The input of an inverter 12 is connected to a junction 16 of the switch and/or link 11 and transistor 10. The output of inverter 12 is connected to the gates of both transistor 10 and an n-channel transistor 13. Transistor 13 is connected between the bit line 20 of the memory and the low voltage source ($V_{ss}$). Each bit line 20 is also connected, as is conventional, to the input of a sense amplifier 14 whose output provides the memory data output 15.

In normal operation, the switch and/or link 11 is "closed" so that the junction 16 at input of inverter 12 and transistor 10 assumes a logic high state and the output of inverter 12 then assumes a logic low state. The corresponding low potential at the gates of transistor 10 and transistor 13 keep both transistors 10, 13 turned off. Thus, so long as the potential at the input of inverter 12 remains high, the bit line 20 is free to operate either high or low and the memory functions normally. If the switch and/or link 11 is opened circuited, either by a software command (for example, by opening a switch) or because of a physical intrusion (breaking the link), the potential at the junction 16 at the input of inverter 12 and transistor 10 will eventually drift to a logic low state due to naturally occurring current leakage paths. When the logic level at the input of invertor 12 goes low its output will switch high. This sets the gate of transistor 10 high and also sets the gate of transistor 13 high causing both transistors to conduct thereby assuming a low impedance between source and drain. This conductive state of transistor 10 causes the input of inverter 12 to remain low, thus latching or locking this state of transistor 10 and inverter 12. The conductive state of transistor 13 ties the bit line low preventing any data from being passed to sense amplifier 14 and thence to the memory output 15. Thus, circuit 1 acts as a trigger or latch to lock or block the memory output from being read.

Figure 2:
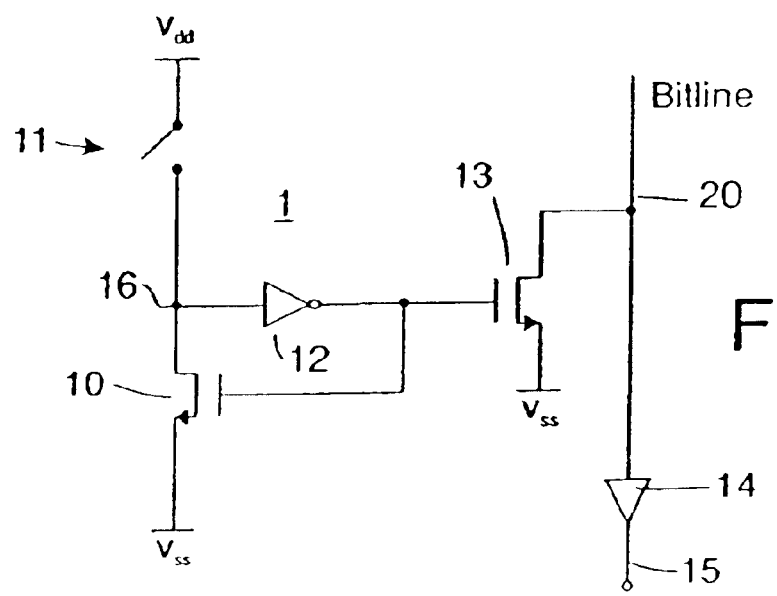
FIG. 2 is a schematic diagram of one embodiment of a bit line block circuit.

Those skilled in the art will realize, of course, that circuit 1 can be modified to tie the bit line 20 high as opposed to tieing it low as done in connection with the embodiment of FIG. 2. Additionally, those skilled in the art will be able to adapt circuit 1 to protect the word lines 21 instead of (or in additional to) the bit lines 20. Moreover, those skilled in the art will be able to adapt the block circuit 1 for use with either P type or N type transistors as a matter of design choice.

Figure 3:
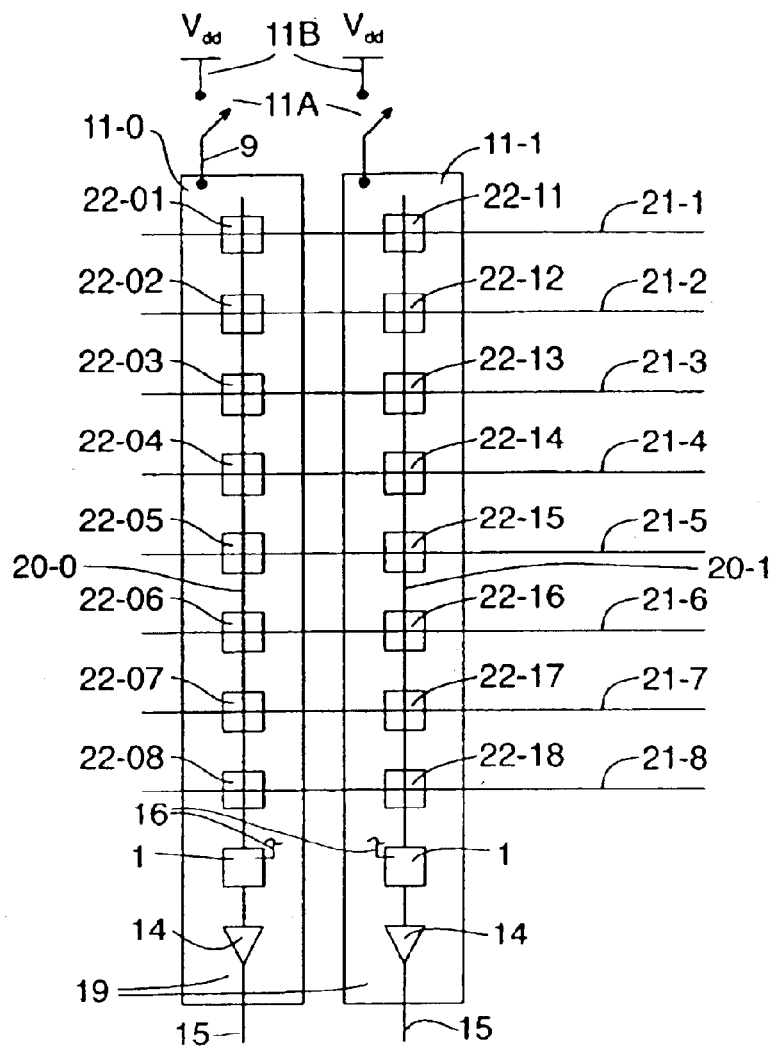
FIG. 3 is a schematic diagram of a small portion of an array of memory cells having bit lines protected by the bit line block circuit.

The data is made very difficult to read out by the reverse engineer due to the presence of the aforedescribed circuit assuming that the link and/or switch 11 is open circuited to bring the circuit into play. Additionally, to make things even more difficult for the reverse engineer, circuit 1 is preferably placed under a metal layer 19 (see FIG. 3) of the type used to protect memory cells 22 from SEM and/or VCSEM. In FIG. 3, circuit 1 is shown tucked underneath metal layer 19 and indeed the junction 16 between transistor 10 and inverter 12 is connected to layer 19. Layer 19 is also preferably tied to $V_{dd}$ at connection 11B and therefore layer 19 serves as a link 11 in its normal closed position when layer 19 is in place. If the reverse engineer dissolves away layer 19 in order to try to use SEM and/or VCSEM scanning of the memory contents, the reverse engineer will find it exceedingly difficult to try to read the memories since bit line 20 will be clamped to $V_{ss}$ if the circuit 1 of FIG. 2 is used or alternatively $V_{dd}$ if circuit 1 is modified to clamp to $V_{dd}$ as opposed to $V_{ss}$. In either case, the constant voltage of the bit lines will deflect electron beam scanning without revealing the state of the circuit below the constant potential ($V_{dd}$ or $V_{ss}$) provided by the bit line block circuit 1 which includes a trigger or locking function. Since layer 19 is acting as a link 11, those skilled in the art will appreciate that additional switches, such as switch 11A shown in FIG. 3 can be inserted, if desired, in series in the connection to $V_{dd}$. Those switches can be arranged to occur in line 9 as shown in FIG. 3 or can be arranged to occur between layer 19 and junction 16, as desired. A switch, such as switch 11A, may be easily implemented, for example, as a transistor switch which responds to a decoded state of a binary number stored in dynamic memory, for example. If the IC is an ASIC, for example, which includes a controller or other CPU on board the ASIC, that controller or CPU, under software control, could examine an inputted password and only unlock memory cell 22 (by closing switch 11A) in response to receipt of a correct password. As such, circuit 1 of FIG. 2 can thus be made effective to thwart the reverse engineer who tries to access to the data by either physical methods, such as removing metal layer 19, or by trying to read the data on bit line 15 as the integrated circuit addresses the word lines 21 during normal circuit operation.

Only sixteen memory cells are shown in FIG. 3 for ease of illustration. Those skilled in the art realize, of course, that a ROM, EPROM, EEPROM or other memory device typically has many (for example, millions of) memory cells and each of the cells or only some of the cells may be protected in accordance with the present invention, as a matter of design choice. For example, data stored in memory is usually stored as bytes or words of data. Some practicing the present invention may wish to use one or more circuits 1 only on certain bit lines 20 of an array of memory cells 22 while others may chose to use one or more circuits 1 in connection with all bit lines 20. Alternatively, some practicing the present invention may wish to use one or more circuits 1 only on certain word lines 21 of an array of memory cells 22 while others may chose to use one or more circuits 1 in connection with all word lines 21. Still others practicing the present invention may choose to utilize circuit (s) 1 on some or all bit 20 lines and on some or all word lines 21. The reference numbers on FIG. 3 often include a dash and one or two additional numbers. Those additional numbers after the dash refer to column number, rows numbers or column and row numbers, as the context requires, of the cells in the array of memory cells.

Additionally, instead of using the circuitry 1 of FIG. 2 as a bit line block or in addition to using it as a bit line block, some practicing the present invention may find it advisable to lock the address or word lines 21 either high or low, as desired, using the circuitry of FIG. 2 attached to word lines 21 as opposed to bit lines 20. Indeed some lines might be locked high while other would be locked low, just to confuse the reverse engineer further. Since a typical memory array includes many word lines 21 and many bit lines 20, the circuitry of FIG. 2 may be used many times on a-particular chip. Those skilled in the art will realize that the physical size of the circuitry 1 of FIG. 2 is quite small and it can be utilized to-protect bit lines and/or word lines of an array of memory cells 22 rather economically when it comes to space considerations on an integrated circuit.

Those skilled in the art will also realize that the word lines 21 and bit lines 20 can be set up so that they are accessible both to external connections to an integrated circuit and also used on board the integrated circuit for other purposes. For example, the word lines 21 and bit lines 20 may be brought out to external connections for ease of entering data into an array of memory cells 22. After an IC having such memory is appropriately programmed with data, it may be that the designer will want to provide on-board access to the data without providing external access. In such an event, the data on the bit lines 15 would likely be passed through a series of gates and/or a sense amplifier before being tied to an external connection pad on the IC. Of course, some practicing the present invention may choose to use circuit(s) 1 only on externally accessible connections while other may choose to use circuit(s) 1 on both external connections and on internal connections. It that case separate bit circuits 1 would preferably have separate switches 11A.

Figure 4:
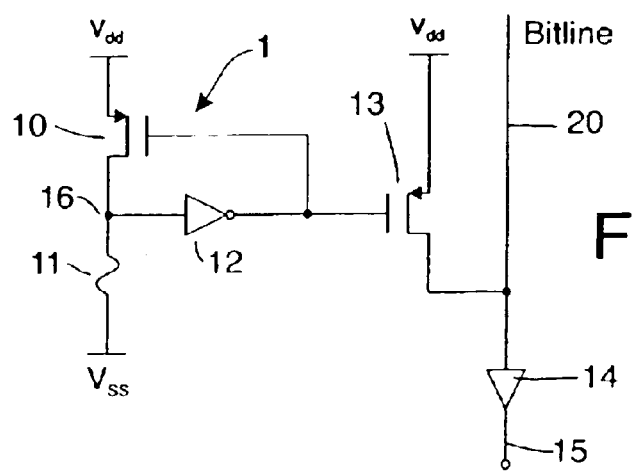
FIG. 4 is a schematic diagram of another embodiment of a bit line block circuit.

Turning to FIG. 4, FIG. 4 shows another embodiment of a block circuit 1 similar to that of FIG. 2, but here the bit line 20 instead of being tied to a relatively low voltage, $V_{ss}$, when transistor 13 goes into conduction, is instead coupled to a relatively high constant voltage $V_{dd}$ when transistor 13 goes into conduction. In this embodiment the switch and/or link 11 couples junction 16 (between invertor 12 and transistor 10) to ground ($V_{ss}$) so that if this embodiment of circuit 1 is used in connection with the memory cells shown in FIG. 3, metal layer 19 is then tied or connected to $V_{ss}$ as opposed to $V_{dd}$ as shown. Those skilled in the art will realize, of course, that the bit line 20 can be caused to either assume a relatively high state ($V_{dd}$) or a relatively low state ($V_{ss}$) depending upon how block circuit 1 is arranged. In either case, holding the bit line 20 at a constant voltage ($V_{dd}$ or $V_{ss}$) makes the circuit much less susceptible to reverse engineering using SEM and/or VCSEM techniques. Additionally, the switch and/or link 11 can be tied to $V_{dd}$ or $V_{ss}$, as desired, depending on whether it is in series with the source or drain of transistor 10, as desired.

Additionally, while each bit line 20 which is to be protected would have an associated transistor 13, each transistor 13 can be driven by a separate arrangement of a transistor 10, link and/or a switch 11 and an invertor 12 or by a common arrangement of a transistor 10, a link and/or a switch 11 and an inverter 12 which would then control a plurality of, or possibly all, transistors 13 used with a given array of memory cells 22, as a matter of design choice. Individually controlling each transistor 13 used with each bit line 20 in an array of memory cells 22 by a separate arrangement of a transistor 10, a link and/or switch 11 and an inverter 12 is preferable since it should lead to a integrated circuit which is more robust with respect to thwarting the reverse engineer trying to access the data stored in its memory.

Switch and/or link 11 may be provided by or include a fused link which may be caused to open circuit in response to forcing the gate of transistor 10 to assume a high state by another transistor (not shown) responsive to a software command, for example. In that way a software command could be used to disable the memory by causing transistor 13 to go into conduction and forcing bit line 20 (or word line 21, if coupled to same) to assume a constant voltage thereby rendering the contents of the memory unreadable.

In the present invention, as heretofore described, a word lie 21 or bit line 20 is protected by a metal layer 19 associated with circuit 1 to tie the lines high or low if the metal layer 19 is removed or just open circuited. Further improvements will now be described. In the next embodiment to be described with reference to FIG. 5, the block circuit 1 is improved. In the prior embodiments the reverse engineer could remove $V_{dd}$ and thus disable portions of the block circuit 1 that are necessary to hold the line at a "0" or "1" level. In this next embodiment such a threat is circumvented. Additionally a technique is described for combining overlayers and locks for both the word- and bit-lines in such a way that significantly complicates the reverse engineer's efforts.

Figure 5:
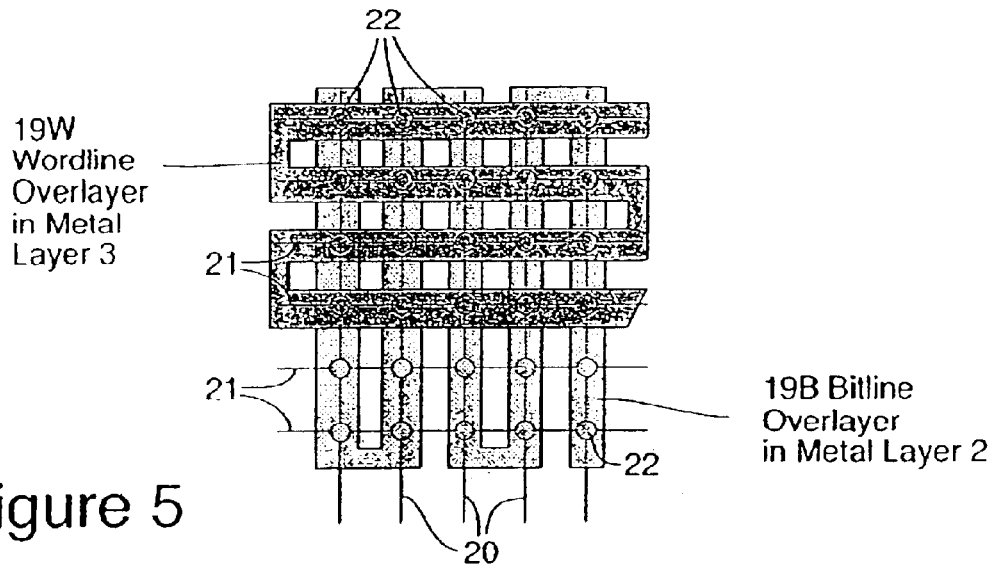
FIG. 5 depicts overlayers with boustrophedonic paths.

In the embodiment of FIGS. 2–4 relating to memory protection via locking the bit lines high or low, a single metal overlayer 19 covers the entire memory region (or at least a portion thereof). Reverse engineering tests on such a structure indicate certain vulnerabilities. One of these was that a good reverse engineer would etch a tiny slot in the overlayer 19, above a bit line 20. This would not activate the bit lock and then by toggling the bit and word lines appropriately, then the entire memory could be read out. To circumvent this potential vulnerability, the block circuit 1 in the embodiment of FIG. 5 utilizes a metal layer 2 formed in a boustrophedonic path (in lieu of a more or less uniform overlay 19 referred to in the previous embodiments). In FIG. 5, the metal overlayer 19A, 19B is formed to just cover each bit-line 20 or word-line 21, wherein if a break is made anyplace in the path of the metal overlayer 19A, 19B, the break is apt to sever the boustrophedonic path and thereby cause the trigger/lock circuit 1 to trigger and block the associated-data lines. Of course, other serpentine paths could alternatively be used.

In FIG. 5 two metal overlayers 19B and 19W are depicted, overlayer 19B being associated with the bit lines 20 and overlayer 19W being associated with the word lines 21. Each overlayer 19B, 19W follows a its own separate boustrophedonic path. Other serpentine paths could alternatively be used and additional overlayers could be used.

Figure 6:
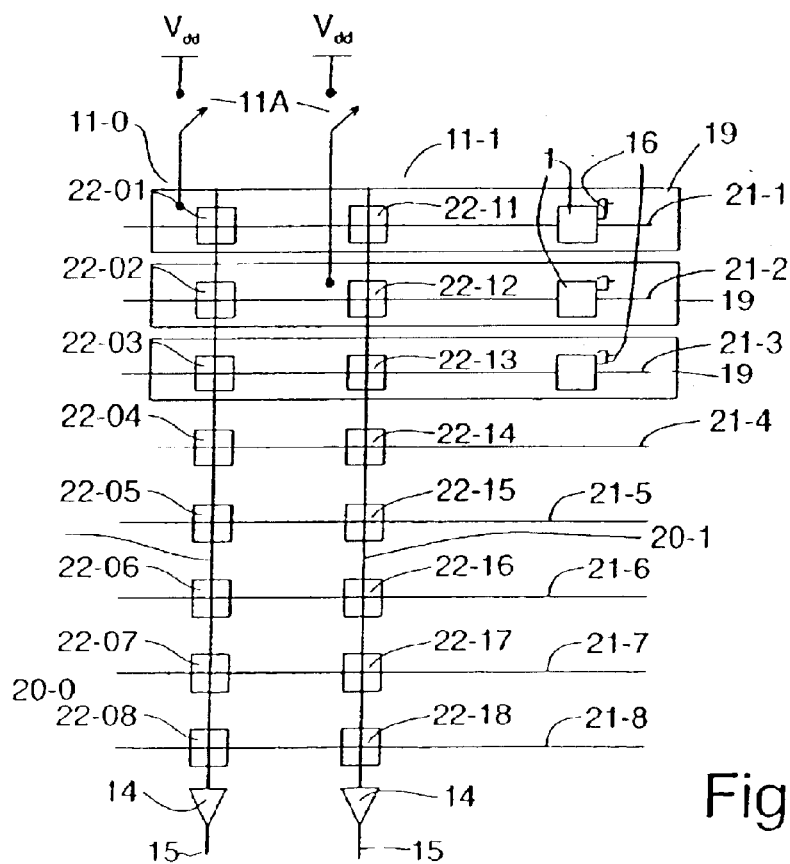
FIG. 6 is a schematic diagram of a small portion of an array of memory cells having word lines protected by a word line block circuit.

In the embodiments exemplified by FIGS. 5 and 6, the reverse engineer cannot easily remove only a portion of overlayers 19, 19W, 19B since these layers are purposefully formed to be narrow in width, i.e., so that they just cover the underlying bit-lines 20 and/or word-lines 21. If the reverse engineer tries to cut through the overlayers 19, 19W, 19B to access bit and/or word lines 21, the reverse engineer is apt to completely cut at least one of the paths thereby causing circuit 1 described herein to change state.

Note that in FIG. 5 metal layer 3 lies above metal layer 2. The two metal layers 2, 3 are typically separated by a layer of silicon oxide, silicon nitride or some other dielectric. Modern processes for making semiconductor devices tend to utilize multiple metal layers, so this processing is in general compatible with modem manufacturing techniques. A first metal layer (i.e. the metal layer closest to the silicon substrate on which the array of memory cells 20 is formed) is used to connect transistors within a subcircuit. $V_{dd}$, for example, is applied to metal layer 3 (overlayer 19W in FIG. 6) so that it acts as an electrical shield keeping the reverse engineer from reading voltages underneath it.

In the embodiments of FIG. 5 and 6 one or more boustrophedonic path metal layers 19 may cover entire (or at least a significant portion of the) memory cells. As such it may be advantageous to include voltage sensing circuits (for example, a tri-state trigger circuit) distributed along the boustrophedonic path. For example, a reverse engineer could attempt to remove a portion of an overlayer 19 and then apply probes to both sides of the break in the boustrophedonic path in order to bridge the break externally. That approach can only be used a few times on a given circuit because it soon becomes impossible to fit additional probes on the integrated circuit, and thus it is impracticable to read any significant portion of a reasonably sized memory using such a technique against this embodiment of the invention.

Also, by distributing the voltage sensing circuits along the boustrophedonic path the reverse engineer is then faced with a bigger challenge regarding the correct placement of the probes.

To circumvent this type of attack by the reverse engineer, in another embodiment of the invention, each bit 20 or word line 21 would have its own metal strip or overlayer 19, each protected separately by a trigger/lock circuit 1. FIG. 3 shows separate overlayers 19 for the bit lines 20. FIG. 6 shows separate overlayers 19 for the several of the word lines 21. Providing a separate overlayer 19 for each bit line 20 and/or for each word line 21 takes up more chip area, but it will likely prove to be worthwhile if the security needed is high. Overwise fewer overlayers 19 can be used, in which case they preferably follow a boustrophedonic or other serpentine path in order to cover all or many of the bits lines 20 and/or word lines 21 or both the word lines 21 and the bit lines 20 as shown in FIG. 5.

Figure 7:
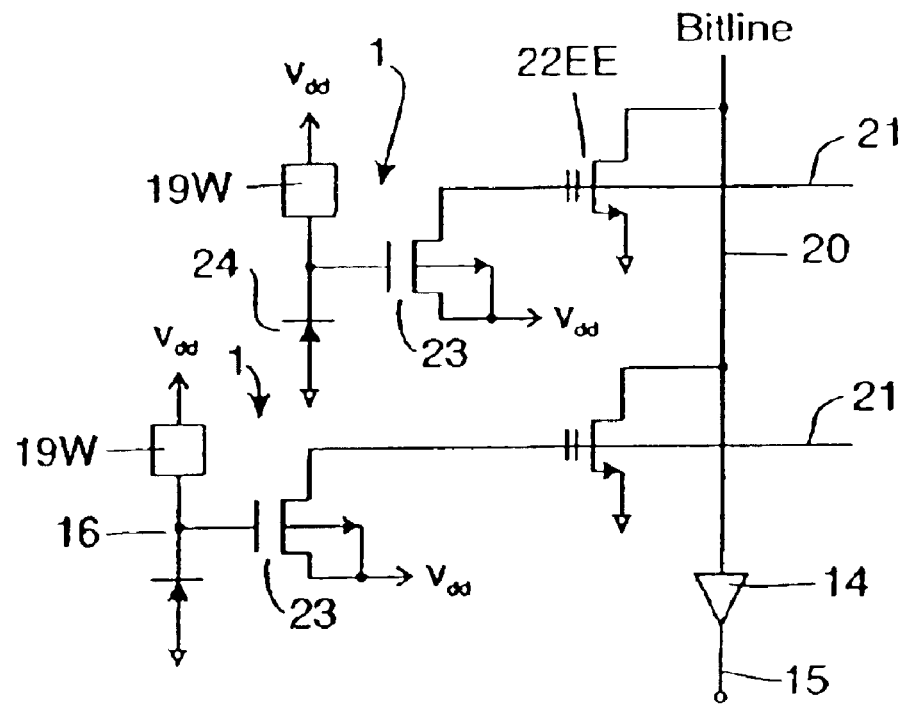
FIG. 7 is a schematic diagram of an embodiment of a word line block circuit.

A word line block circuit 1 with a tri-state trigger is shown by FIG. 7. While this embodiment will be described with reference to EEPROM cells 22EE, this invention can also be used with other types of memory cells, including ROM and RAM cells. The protection of EEPROM cells is important since they are commonly used to store sensitive data.

The embodiment of FIG. 7 is for the specific case of a word-line lock, but the same circuit could be used for a bit-line lock if metal layer 2 is substituted for metal layer 3 as the top layer or overlayer.

Also, in the embodiment of FIG. 7, each wordline (WL) 21 has its own trigger/lock circuit 1. A boustrophedonic-overlayer 19W path would preferably be used if only be-a single trigger/lock circuit 1 were to be deployed or if the number of trigger/lock circuits 1 to be deployed were fewer in number than the number of word lines 21 to be protected. For higher security, a separate trigger circuit is used for each word line 21. The choices here involve a tradeoff between circuit area used for trigger/lock circuits 1 and the amount of protection afforded.

Figure 8:
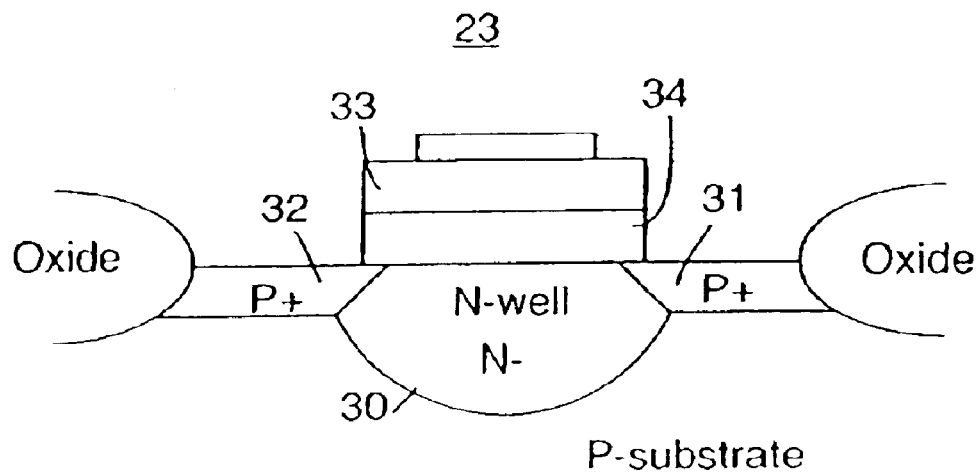
FIG. 8 depicts the details of an FET device-depicted in FIG. 7.

In normal operation, when the overlayer 19W is intact and $V_{dd}$ is applied to the gate of p-type FET 23, turning the FET 23 OFF, the word line 21 assumes whatever potential intended by the programming. However, if overlayer 19W is opened, $V_{dd}$ is then removed from the gate to the FET 23 and, via the reverse-biased diode 24, the gate voltage drops to zero or becomes slightly negative. Since the n-well 30 (see FIG. 8) and the drain of FET 23 are tied to $V_{dd}$, then the nearly zero or negative gate voltage will turn the p-type FET 23 ON permanently.

An array of memory cells is preferably protected by a plurality of trigger/lock circuits 1. If the n-wells 30 for all FETs 23 of a plurality of trigger/lock circuits 1 are commonly connected, then the triggering of any one trigger/lock circuit 1 by the removal of a single strip of metal layer 19W will lock not only the word line 21 at logical "0" by the trigger/lock circuit directly controlled by the metal layer 19W, but also all word lines associated with all of the plurality of trigger/lock circuits 1 which share the same n-well 30. As a result, all memory locations having trigger/lock circuits 1 which are commonly controlled through their common wells 30 are thereby disabled. The FETs 23 in the trigger/lock circuits 1 are, in this embodiment, depicted as p-FETs located in n-wells. The details of FET 23 are shown in the FIG. 8.

The n-well 30 is connected, along with the drain 31, to $V_{dd}$ thereby depleting the n-well region between the source 32 and drain 31. This depletion region, coupled with $V_{dd}$ being also applied to the gate, means the FET 23 is OFF and so the source 32, connected to the word line 21 can float at the word line potential. If the metal layer 3 overlayer 19 is broken, the voltage on the gate 33 becomes negative, thus turning the transistor ON and the word line 21 will lock at ground, or the logical "0" state. The gate 33 is preferably 1 $\mu$m thick polysilicon while the gate oxide 34 is preferably 100 Å thick $SiO_2$. Similarly, all the other p-FETs 23 will have their sources 32 locked at a logic level "0" through the current flowing through the FET for which the metal layer 3 overlayer 19 is opened or which have a common well 30 structure.

Memories are typically common-well structures. Hence, since all the wells 30 are therefore tied to $V_{dd}$, then when one strip 19 opens and the word-line assumes a logic zero state, this action will also make all other word-lines assume a logic zero state. The trigger/lock circuits 1 may be located in a different well or in different wells than are the memories, but in that case, the well(s) for trigger/lock circuits would be of the same conductivity type (typically n-type) and connected to the memory well(s).

Link 11 is often referred to herein as a switch and/or a link. This is due to the fact that the link, which is preferably provided by a layer of conductive material covering at least a portion of the memory cells 22 as described herein, serves as a switch when the link is broken by a reverse engineer trying to gain access to the data in the memory cells 22. Link 11 may also have one or more discrete switches 11A associated therewith for open circuiting the link 11 in response to other stimuli than physical breaking of the link 11 by the reverse engineer. If one or more discrete switches 11 A are provided in series with the link 11, then the link itself can be provided by a conductor which does not physically protect the memory cells 22. However, it is preferred that link 11 physically protect the memory cells 22, as described herein.

Several embodiments of the invention have been described and the semiconductor devices used in the embodiments have been described as being of a particular conductivity type (i.e. p or n conductivity). Those skilled in the art will appreciate the fact that the conductivity types of the disclosed devices may be changed and still utilize the features of the invention described herein.

Having described the invention in connection with preferred embodiments thereof, modification will now doubtfully suggest itself to those skilled in the art. As such, the invention is not to be limited to the disclosed embodiments except as required by the appended claims.

That which is claimed is:

1. A method for blocking unauthorized access to at least one memory location in a semiconductor memory comprising:
    providing a link which assumes an open state when access to the at least one memory location is to be blocked, wherein the link includes a switch which is open and closed under software control; and
    coupling a data line associated with the at least one memory location to a constant voltage source in response to the link assuming said open state.

2. A method for blocking unauthorized access to at least one memory location in a semiconductor memory comprising:
    providing a link which assumes an open state when access to the a least one memory location is to be blocked, wherein the link is formed by an electrically conductive layer which is disposed in a location overlying at least a portion of a data line associated with said at least one memory location; and
    coupling the data line associated with the at least one memory location to a constant voltage source in response to the link assuming said open state.

3. The method of claim 2 wherein said electrically conductive layer is connected, in normal operation, to a constant voltage source.

4. The method of claim 3 wherein physical removal of said electrically conductive layer causes said link to assume said open state.

5. The method of claim 2 wherein said electrically conductive layer is applied over a plurality of memory locations.

6. The method of claim 5 wherein said electrically conductive layer assumes a serpentine path over said plurality of memory locations.

7. The method of claim 6 wherein the serpentine path is a boustrophedonic path.

8. A circuit for blocking access to a data line associated with at least one memory cell, the circuit comprising:
    a first means coupling the data line to a constant voltage source when the first means is conductive;
    a second means coupled in series with a link and/or a switch, the link and/or the switch having an open circuit state and a closed circuit state; and
    an inverter having an input coupled to a junction between the second means and the link and/or the switch, the inverter having an output coupled to an electrode of the first means and also to an electrode of the second means.

9. The circuit of claim 8 wherein the constant voltage source is Vdd.

10. The circuit of claim 8 wherein the constant voltage source is Vss.

11. The circuit of claim 8 wherein the second means and the switch and/or link are all connected in series between Vdd and Vss.

12. The circuit of claim 8 wherein the data line is a bit line.

13. The circuit of claim 8 wherein the data line is a word line.

14. A circuit for blocking unauthorized access to at least one memory location in a semiconductor device comprising:
    a link which has a first state when access to the at least one memory location is to be blocked and has a second state when access to the at least one memory location is not blocked, wherein the link includes a switch means which is open and closed under software control; and
    a data line associated with the at least one memory location coupled to a constant voltage source in response to the link assuming its first state.

15. A circuit for blocking unauthorized access to at least one memory location in a semiconductor device comprising:
    a link which has a first state when access to the at least one memory location is to be blocked and has a second state when access to the at least one memory location is not blocked; and
    a data line associated with the at least one memory location coupled to a constant voltage source in response to the link assuming its first state,
    wherein the link is formed by an electrically conductive layer which is disposed in a location overlying a portion of the data line associated with the at least one memory location.

16. The circuit of claim 15 wherein said electrically conductive layer is connected to a constant voltage source.

17. The circuit of claim 16 wherein physical removal of said electrically conductive layer causes said link to assume its first state.

18. The circuit of claim 15 wherein said electrically conductive layer is disposed over a plurality of memory cells.

19. The circuit of claim 18 wherein said electrically conductive layer is disposed in a serpentine path over said plurality of memory cells.

20. The circuit of claim 19 wherein the serpentine path is a boustrophedonic path.

21. Circuits for blocking unauthorized access to a plurality of memory locations in a semiconductor device, said circuits comprising:

a plurality of links each of which has a first state when access to the associated memory locations is to be blocked and has a second state when access to associated memory locations is not blocked; and a plurality of trigger circuits, each trigger circuit being directly controlled by an associated one of said links and being effective to couple a data line associated with selected ones of said memory locations to a constant voltage source in response to the associated one of said links assuming its first state, wherein each link is formed by an electrically conductive layer which is disposed in a location overlying at least a portion of the data line associate with selected ones of said memory locations.

22. The circuits of claim 21 wherein the circuits include means for causing each one of said plurality of trigger circuits to assume its first state in response to only one of said links assuming its first state.

23. The circuits of claim 21 wherein physical removal of the electrically conductive layer causes at least one of the plurality of links formed by the electrically conductive layer to assume its first state.

\* \* \* \* \*